United States Patent
Freund (10) Patent No.: US 9,105,807 B2
(45) Date of Patent: Aug. 11, 2015

(54) SEMICONDUCTOR OPTICAL EMITTING DEVICE WITH GROOVED SUBSTRATE PROVIDING MULTIPLE ANGLED LIGHT EMISSION PATHS

(71) Applicant: LSI Corporation, San Jose, CA (US)

(72) Inventor: Joseph M. Freund, Fogelsville, PA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 158 days.

(21) Appl. No.: 13/867,435

(22) Filed: Apr. 22, 2013

(65) Prior Publication Data

US 2014/0312372 A1    Oct. 23, 2014

(51) Int. Cl.
*H01L 33/20* (2010.01)
*H01L 33/46* (2010.01)
*H01L 33/00* (2010.01)

(52) U.S. Cl.
CPC .............. *H01L 33/20* (2013.01); *H01L 33/46* (2013.01); *H01L 33/007* (2013.01)

(58) Field of Classification Search
CPC . H01L 33/02366; H01L 31/056; H01L 33/58; H01L 33/60; H01L 33/20
USPC .......................................................... 257/98
See application file for complete search history.

(56) References Cited

U.S. PATENT DOCUMENTS

| | | |
|---|---|---|
| 3,150,999 A | 9/1964 | Rudenberg et al. |
| 4,348,254 A | 9/1982 | Lindmayer |
| 5,032,879 A | 7/1991 | Buchmann et al. |
| 5,258,991 A | 11/1993 | Peterson |
| 5,574,744 A | 11/1996 | Gaw et al. |
| 5,692,862 A | 12/1997 | Hilde |

(Continued)

FOREIGN PATENT DOCUMENTS

| | | |
|---|---|---|
| CN | 102136676 A | 7/2011 |
| EP | 0410067 A1 | 7/1989 |

(Continued)

OTHER PUBLICATIONS

G. Bernhardt et al., "Performance of Zr and Ti Adhesion Layers for Bonding of Platinum Metallization to Sapphire Substrates," Sensors and Actuators B: Chemical, Jun. 2001, pp. 368-374, vol. 77, No. 1.

(Continued)

*Primary Examiner* — Ermias Woldegeorgis
(74) *Attorney, Agent, or Firm* — Suiter Swantz pc llo (57) ABSTRACT

A semiconductor optical emitting device comprises an at least partially transparent substrate and an active semiconductor structure arranged on a first side of the substrate. A first portion of light generated by the active semiconductor structure is emitted through the substrate from the first side of the substrate to a second side of the substrate along a primary light emission path. The second side of the substrate has a groove formed therein with at least first and second surfaces configured to reflect respective additional portions of the light generated by the active semiconductor structure along respective first and second angled light emission paths. The first and second angled light emission paths may be in opposite directions to one another and substantially perpendicular to the primary light emission path, although numerous other light emission path arrangements are possible.

21 Claims, 7 Drawing Sheets

(56) References Cited

U.S. PATENT DOCUMENTS

| | | |
|---|---|---|
| 5,696,862 A | 12/1997 | Hauer et al. |
| 6,005,262 A | 12/1999 | Cunningham et al. |
| 6,597,713 B2 | 7/2003 | Ouchi |
| 6,633,598 B1 | 10/2003 | Kimizuka et al. |
| 6,879,611 B1 | 4/2005 | Johansson et al. |
| 6,922,423 B2 | 7/2005 | Thornton |
| 2002/0037137 A1 | 3/2002 | Wu et al. |
| 2002/0123164 A1* | 9/2002 | Slater et al. ............ 438/39 |
| 2003/0002552 A1 | 1/2003 | Nagara |
| 2003/0021327 A1 | 1/2003 | Murry |
| 2003/0026303 A1 | 2/2003 | Ouchi |
| 2003/0123508 A1 | 7/2003 | Werner et al. |
| 2004/0264537 A1 | 12/2004 | Jackson |
| 2005/0147360 A1 | 7/2005 | Kwak et al. |
| 2005/0189473 A1 | 9/2005 | Schrodinger |
| 2006/0146904 A1 | 7/2006 | Guenter et al. |
| 2006/0237732 A1* | 10/2006 | Nagai et al. ............ 257/91 |
| 2007/0025405 A1 | 2/2007 | Pan et al. |
| 2007/0057271 A1* | 3/2007 | Schiaffino et al. ........ 257/99 |
| 2008/0240194 A1 | 10/2008 | Maeda et al. |
| 2011/0182315 A1 | 7/2011 | Shiozaki et al. |
| 2011/0285308 A1* | 11/2011 | Crystal et al. ............ 315/287 |
| 2012/0183009 A1 | 7/2012 | Adachi et al. |
| 2012/0281727 A1 | 11/2012 | Fang et al. |

FOREIGN PATENT DOCUMENTS

| | | |
|---|---|---|
| EP | 0975072 A2 | 1/2000 |
| GB | 2490596 A | 11/2012 |
| JP | 62195191 A | 8/1987 |
| JP | 2000193852 A | 7/2000 |
| JP | 2000040840 | 8/2000 |
| JP | 2000349392 A | 12/2000 |
| WO | 03/000019 A2 | 1/2003 |

OTHER PUBLICATIONS

S.-H. Huang et al., "Improved Light Extraction of Nitride-Based Flip-Chip Light-Emitting Diodes Via Sapphire Shaping and Texturing," IEEE Photonics Technology Letters, Dec. 2006, 14 pages, vol. 18, No. 24.

H. Gao et al., "Improvement of GaN-Based Light Emitting Diodes Performance Grown on Sapphire Substrates Patterned by Wet Etching," Solid State Lighting and Solar Energy Technologies, Proceedings of the SPIE, 2008, 6 pages, vol. 6841.

H. Qiang et al., "Characterization of Thick GaN Films Directly Grown on Wet-Etching Patterned Sapphire by HVPE," Chinese Physics Letters, Sep. 2009, pp. 96801-1-96801-4, vol. 26, No. 9.

H.-S. Cheong et al., "Growth and Characteristics of Near-UV LED Structures on Wet-Etched Patterned Sapphire Substrate," Journal of Semiconductor Technology and Science, Sep. 2006, pp. 199-205, vol. 6, No. 3.

J. Wang et al., "Fabrication of Patterned Sapphire Substrate by Wet Chemical Etching for Maskless Lateral Overgrowth of GaN," Journal of the Electrochemical Society, 2006, pp. 182-185, vol. 153, No. 3.

I.L. Krestnikov et al., "Photopumped InGaN/GaN/AlGaN Vertical Cavity Surface Emitting Laser Operating at Room Temperature," Physical Status Solidi, 1999, pp. 511-515, vol. 216.

Kwok K. NG, "Complete Guide to Semiconductor Devices," 2nd Edition, IEEE Press, Wiley-Interscience, Jul. 2002, pp. 431-437.

S.M. Sze, "Physics of Semiconductor Devices," 1981, Wiley-Interscience, 2nd Edition, 117.

* cited by examiner

FIG. 8 ASYMMETRIC FULL V-GROOVE

FIG. 7 SYMMETRIC FULL V-GROOVE

ASYMMETRIC FLAT-BOTTOM CAVITY

FIG. 11

SYMMETRIC FLAT-BOTTOM CAVITY

SEMICONDUCTOR OPTICAL EMITTING DEVICE WITH GROOVED SUBSTRATE PROVIDING MULTIPLE ANGLED LIGHT EMISSION PATHS

FIELD

The field relates generally to semiconductor devices, and more particularly to semiconductor optical emitting devices.

BACKGROUND

Many different types of semiconductor optical emitting devices are known in the art, including surface emitting lasers and light emitting diodes. Some of these devices utilize gallium nitride (GaN) to form an active semiconductor structure for light generation. Surface emitting lasers and laser diodes based on GaN have come into widespread use in numerous applications, including traffic lights and other types of solid-state lighting, indoor and outdoor electronic displays, backlighting for liquid crystal displays, and many others. These GaN-based devices have a number of significant advantages, such as good optical beam characteristics and ease of batch fabrication and packaging. Other types of semiconductor optical emitting devices provide similar advantages using other semiconductor materials.

SUMMARY

In one embodiment, a semiconductor optical emitting device comprises an at least partially transparent substrate and an active semiconductor structure arranged on a first side of the substrate. A first portion of light generated by the active semiconductor structure is emitted through the substrate from the first side of the substrate to a second side of the substrate along a primary light emission path. The first and second sides of the substrate may comprise, for example, respective front and back sides of the substrate. The second side of the substrate has a groove formed therein with the groove having at least first and second surfaces configured to reflect respective additional portions of the light generated by the active semiconductor structure along respective first and second angled light emission paths.

By way of example only, the first and second angled light emission paths may be in opposite directions relative to one another and substantially perpendicular to the primary light emission path. Numerous other light emission path arrangements are possible.

The semiconductor optical emitting device may be implemented in the form of a surface emitting laser or a light emitting diode, or in other forms.

One or more surface emitting lasers, light emitting diodes or other semiconductor optical emitting devices may be implemented with associated control circuitry in a lighting system, an electronic display or another type of system or device. As a more particular example, multiple semiconductor optical emitting devices may be combined in the form of an array having associated control circuitry and implemented in a lighting system, an electronic display or another type of system or device.

Other embodiments of the invention include but are not limited to methods, apparatus, integrated circuits and processing devices.

DETAILED DESCRIPTION

Embodiments of the invention will be illustrated herein in conjunction with exemplary surface emitting lasers each of which includes at least one substrate groove for providing multiple angled light emission paths to supplement a primary light emission path. It should be understood, however, that embodiments of the invention can be implemented using a wide variety of alternative types and configurations of semiconductor optical emitting devices, including, for example, light emitting diodes.

Figure 1:
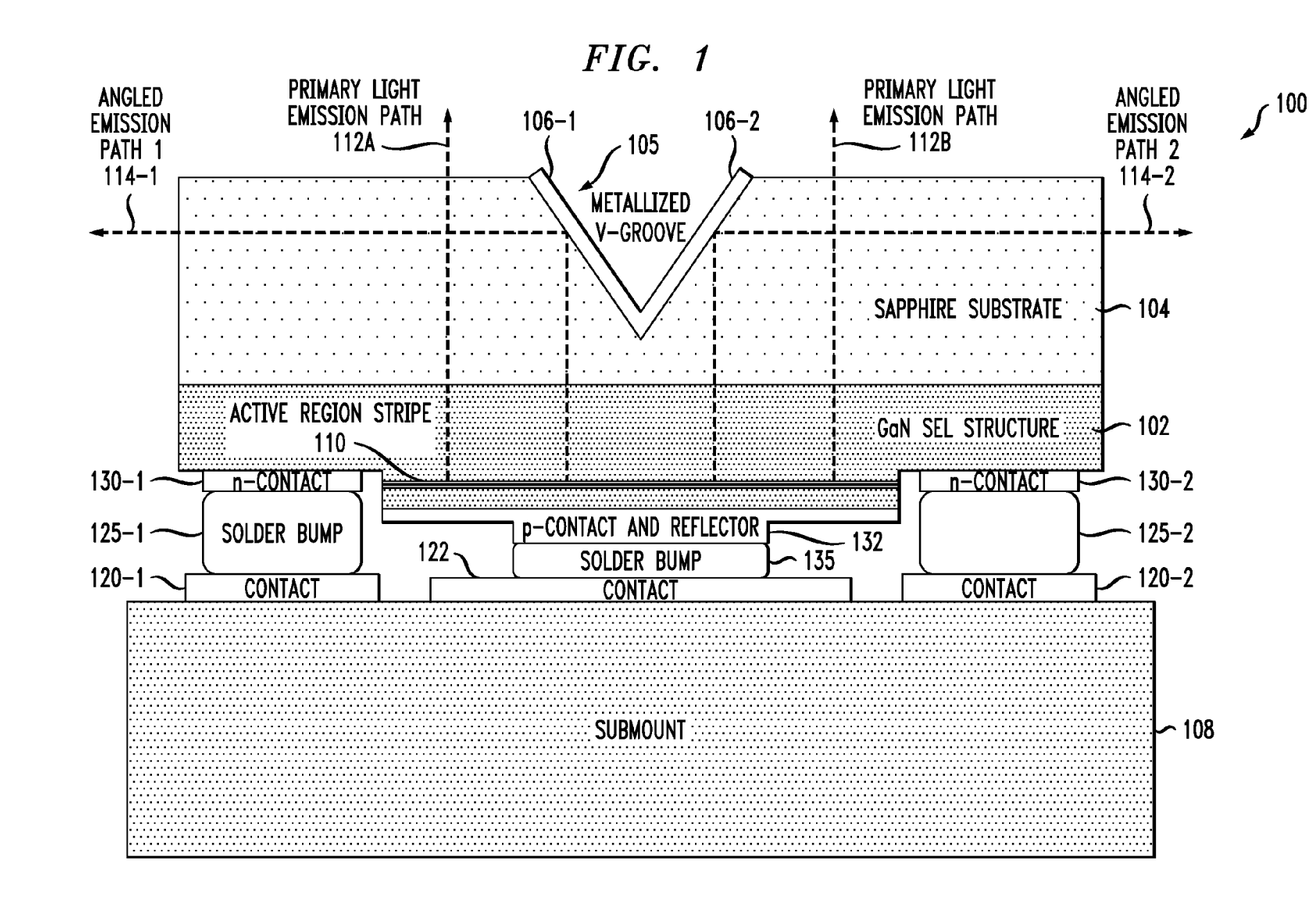
FIG. 1 is a cross-sectional view of an exemplary semiconductor optical emitting device comprising a surface emitting laser having a grooved substrate in an illustrative embodiment.

FIG. 1 shows an exemplary semiconductor optical emitting device in the form of a surface emitting laser 100. The surface emitting laser or SEL 100 comprises an active semiconductor structure 102 arranged on a first side of a sapphire substrate 104.

The active semiconductor structure 102 in this embodiment illustratively comprises a GaN SEL structure, but numerous other semiconductor materials and configurations can be used in other embodiments. The GaN SEL structure may be epitaxially grown or otherwise formed on the sapphire substrate using well-known techniques.

The sapphire substrate 104 is substantially transparent at one or more wavelengths of the light generated by the active semiconductor structure 102, and is an example of what is more generally referred to herein as an "at least partially transparent substrate." Such a substrate may be substantially transparent for a particular range of wavelengths that encompass typical wavelengths of light generated by the active semiconductor structure 102. A wide variety of different types of substrates suitable for having grooves formed therein using etching or other processing operations may be used in other embodiments. Accordingly, use of a sapphire substrate is not required.

A second side of the sapphire substrate 104 in this embodiment has a groove 105 formed therein. The groove 105 is illustratively in the form of a v-shaped groove or "v-groove" and has first and second metallized surfaces 106-1 and 106-2. The first and second sides of the sapphire substrate 104 as illustrated in the figure correspond to respective lower and upper primary surfaces of the substrate, and may also be referred to as respective front and back sides of the substrate, although the term "side" as used in this context is intended to be broadly construed so as to encompass other substrate arrangements relative to the active semiconductor structure 102 and groove 105.

Also, the term "groove" is intended to be broadly construed, and includes numerous different shapes and configurations. An exemplary process for forming the groove 105 in substrate 104 will be described below in conjunction with FIGS. 2 through 6, and additional examples of substrate grooves suitable for use in embodiments of the invention are illustrated in FIGS. 7 through 12.

The surface emitting laser 100 further comprises a submount 108 configured to support the active semiconductor structure 102 and its associated substrate 104. Part of an upper surface of the submount 108 underlies an active region stripe 110 of the active semiconductor structure 102. This arrangement of active semiconductor structure 102, substrate 104 and submount 108 is an example of a flip-chip configuration of a surface emitting laser. Although such flip-chip configurations can provide enhanced thermal management and optical coupling of light emission, other types and arrangements of semiconductor optical emitting device packaging can be used.

Light is generated in the surface emitting laser 100 via the active region stripe 110 of the active semiconductor structure 102, although numerous other light generation arrangements may be used in other embodiments. Portions of the generated light follow distinct light emission paths as indicated by the dashed lines in the figure, including a primary light emission path 112 and first and second angled light emission paths 114-1 and 114-2. Accordingly, a first portion of the light generated by the active semiconductor structure 102 is emitted through the substrate 104 from the first side of the substrate to the second side of the substrate along the primary light emission path 112. The first and second surfaces 106-1 and 106-2 of the groove 105 are configured to reflect respective additional portions of the light generated by the active semiconductor structure 102 along the respective first and second angled light emission paths 114-1 and 114-2.

In this embodiment, the primary light emission path 112 more particularly comprises first and second parallel light emission paths 112A and 112B on respective opposite sides of the groove 105. Also, the first and second angled light emission paths 114-1 and 114-2 are in opposite directions to one another and substantially perpendicular to the primary light emission paths 112A and 112B. It is to be appreciated, however, that these particular primary and angled light emission paths are exemplary only, and other embodiments can include other combinations of multiple light emission paths. For example, in some embodiments, it is possible for the primary light emission path to also be an angled light emission path. Also, more than two angled light emission paths may be provided.

An "angled light emission path" as that term is used herein refers generally to a light emission path that is at a predetermined angled relative to another designated light emission path, such as a primary light emission path. A variety of different angles between paths can be used, and the groove 105 in the substrate 104 can be configured accordingly. Thus, for example, alternative angled light emission paths may be at approximately 45 degree angles relative to a primary light emission path.

It should be understood that the surfaces 106-1 and 106-2 will also generally allow a certain amount of light to pass therethrough rather than being reflected, so as to exit the device along an axis of the primary light emission path 112, although this part of the primary light emission path is not explicitly illustrated in the figure. Accordingly, paths 112 and 114 shown by dashed lines are exemplary only and other light emission paths may be followed by other portions of the generated light.

The surface emitting laser 100 of FIG. 1 is illustratively configured such that the metallized surfaces 106 of the groove 105 direct portions of the generated light in two additional directions at respective angles to the primary direction of light emission. The surface emitting laser 100 in this embodiment is an example of what is referred to herein as a tri-directional semiconductor optical emitting device. Again, light may be emitted in more than three directions in other embodiments. For example, quadrilateral cavity grooves of the type shown in FIGS. 11 and 12 can be used to provide four additional directions of light emission at respective angles to the primary direction of light emission.

As indicated above, the submount 108 supports the active semiconductor structure 102 and the substrate 104. Multiple contacts 120 and 122 are formed on an upper surface of the submount 108 for coupling via solder bumps to corresponding contacts 130 and 132 on a lower surface of the active semiconductor structure 102.

More particularly, in this embodiment, the contacts formed on the upper surface of the submount 108 include first and second submount contacts 120-1 and 120-2 coupled via respective solder bumps 125-1 and 125-2 to respective n-contacts 130-1 and 130-2 of the active semiconductor structure 102, and a third contact 122 coupled via solder bump 135 to a p-contact 132 of the active semiconductor structure 102. The p-contact 132 is formed integrally with or otherwise associated with a reflector of the active semiconductor structure.

The above-noted reflector is generally arranged to reflect light generated in the active region stripe 110 away from the lower surface of the active semiconductor structure 102 and back toward the substrate 104.

Again, the surface emitting laser 100 is exemplary only, and other types of SEL structures or more generally semiconductor optical emitting devices may be used. For example, as indicated previously, the SEL structure used as an active semiconductor structure in FIG. 1 could be replaced in other embodiments with other types of semiconductor laser structures as well as light emitting diode structures.

The groove 105 may be formed by etching through a patterned opening in a passivation layer formed on the second side of the substrate 104, as will now be described with reference to FIGS. 2 through 6.

Figure 2:
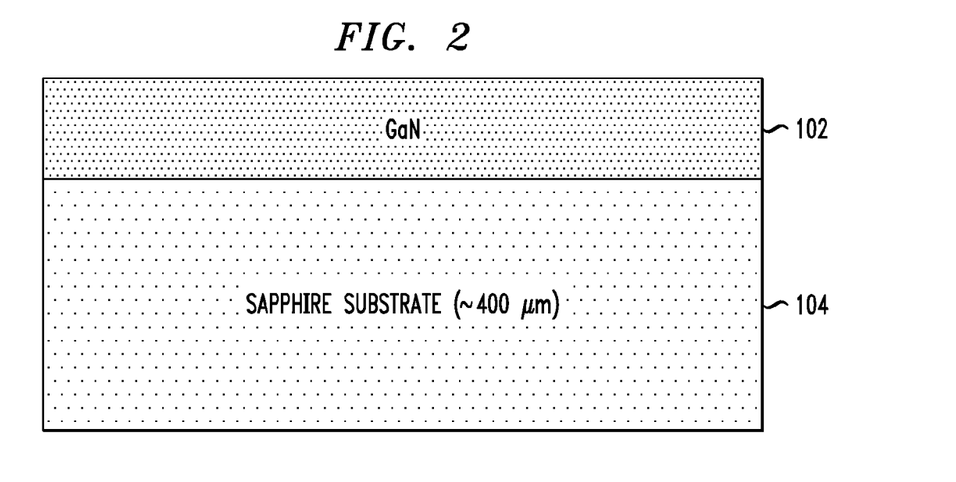
FIGS. 2 through 6 illustrate respective steps in a process of forming the groove in the substrate of the surface emitting laser of FIG. 1.

FIG. 2 shows the active semiconductor structure 102 attached to the first side of the sapphire substrate 104 with the sapphire substrate being of a particular initial thickness, in this example approximately 400 micrometers (µm). It is assumed that the GaN SEL structure is formed by growing multiple GaN layers epitaxially on the sapphire substrate using metal organic vapor deposition (MOCVD). Similar techniques may be used to form other types of active semiconductor structures, such as light emitting diode structures.

Figure 3:
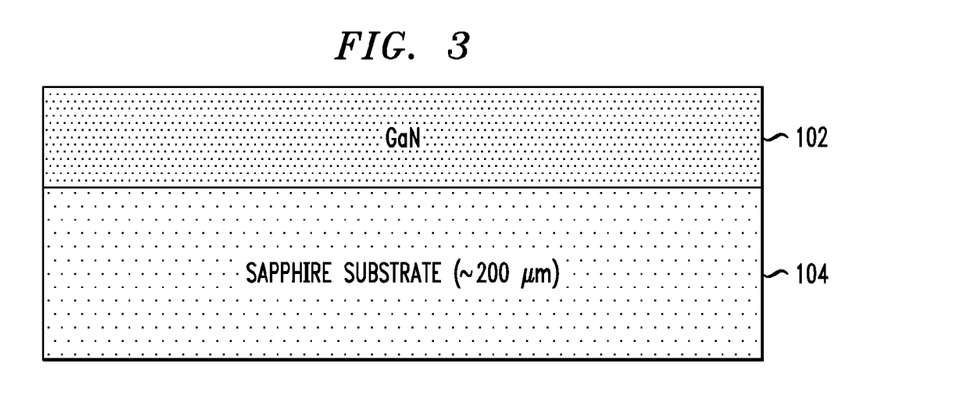

The second side of the sapphire substrate 104 is then ground down to a desired thickness, in this example approximately 200 µm, resulting in the structure shown in FIG. 3. As noted above, the first and second sides of the substrate 104 are also referred to herein as front and back sides, respectively. Accordingly, in the present embodiment a back side grinding process is assumed to be applied in order to reduce the thickness of the substrate in the manner shown in FIG. 3.

Although the desired thickness in this example is approximately 200 µm, numerous other thicknesses may be used. It should therefore be appreciated that thicknesses and other dimensions referred to herein are exemplary only. The desired thickness of the substrate 104 as illustrated in FIG. 3 may be selected such that when the substrate is etched to form the groove 105, a designated minimum amount of substrate material remains below the bottom of the groove in order to reduce the mean free path and improve light extraction. Also, a GaN buffer layer of the active semiconductor structure 102 may be used as an etch stop to provide additional reduction in the mean free path.

Figure 4:
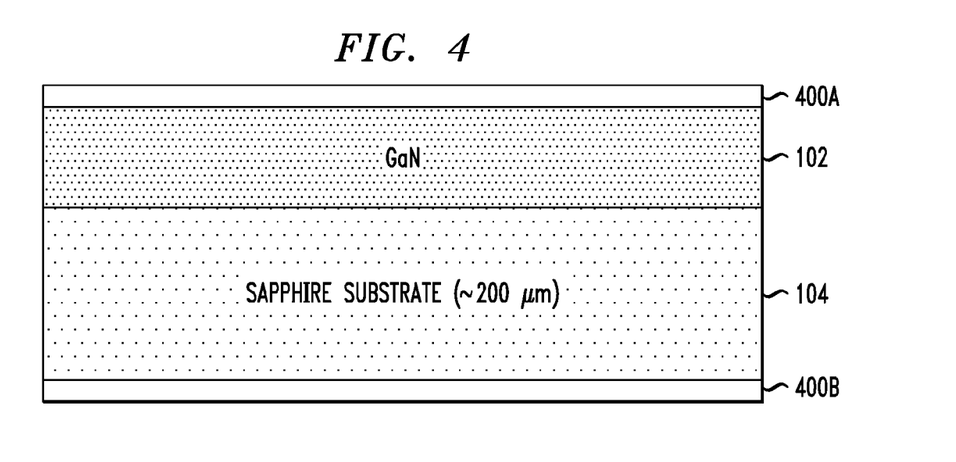

Passivation layers 400A and 400B are then formed on the upper and lower surfaces of the FIG. 3 structure, as illustrated in FIG. 4. Such layers may be deposited, for example, using plasma-enhanced chemical vapor deposition (PECVD). The passivation layers may be approximately 1.0 to 2.0 µm thick and formed from silicon dioxide (SiO$_2$), although other thicknesses and materials could be used.

Figure 5:
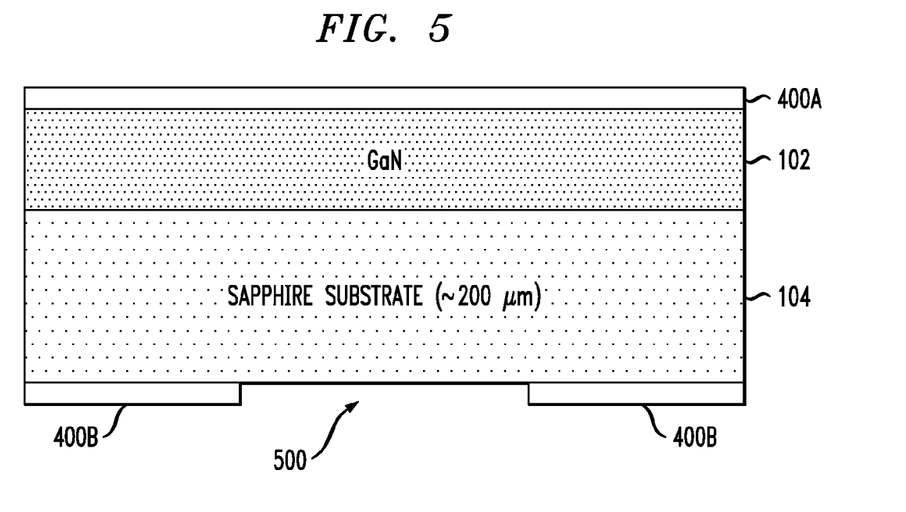

Next, a patterned opening 500 is formed in the passivation layer 400B that overlies the second side of the substrate 104, as shown in FIG. 5. This may involve, for example, etching the passivation layer 400B into stripe masks using conventional wet etching techniques, such as a buffer-oxide-etch (BOE) process.

Figure 6:
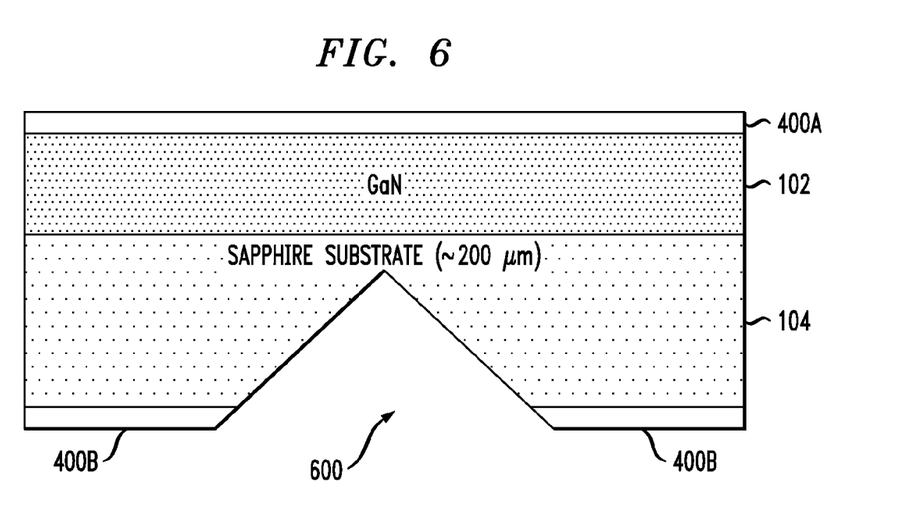

Groove 600 is then etched into the second side of the substrate 104 through the patterned opening in the passivation layer 400B, as illustrated in FIG. 6. As in the FIG. 1 embodiment, the groove 600 illustrated in FIG. 6 is a v-groove. The etch profile in this embodiment will depend on the direction of the v-groove. For example, if the v-groove is parallel to the <1-100> sapphire orientation, the v-groove is symmetrical with respect to that orientation and the inclined surfaces of the v-groove are near the {11-26} planes of the substrate. As another example, if the v-groove is parallel to the <11-20> sapphire orientation, the v-groove is asymmetrical with respect to that orientation, and one of the inclined surfaces is near the (1-102) r-plane and the other is near the (1-104) plane of the substrate.

The groove 600 may be formed by wet etching with a mixed solution of H$_2$SO$_4$:H$_3$PO$_4$ in a ratio of 3:1. A suitable etch temperature is approximately 270 to 300° C., yielding an etch rate of approximately 1400-1800 Å/min. Wet etching of this type at 300° C. for 10 hours results in a groove depth of approximately 90 to 100 µm.

Process parameters such as etch time and temperature, solutions, passivation layer thickness and patterned opening size can be varied to alter the depth and width of the groove 600. The groove may be aligned with the back side pattern and fabricated using an inductively-coupled plasma etcher for electrical isolation.

After the groove 600 is etched, the sidewalls of the groove are metalized to provide reflective surfaces, such as surfaces 106-1 and 106-2 of groove 105 in FIG. 1. The metallization may comprise a stack of multiple metal layers, such as a stack of titanium (Ti) and gold (Au) layers, with the Ti layer having a thickness on the order of 20 to 40 nanometers (nm) and the underlying Au layer having a thickness on the order of 50 to 300 nm. The particular number of layers, as well as the types of materials used and the layer thicknesses, may be adjusted to obtain a desired reflectivity. It should also be noted that any of a variety of different techniques may be used to deposit the metallization, including, for example, atomic layer deposition (ALD) and sputtering.

After the metalized groove is formed in the manner described above, the remaining portions of the passivation layers 400 are removed, and the n-contacts and p-contact are formed on the active semiconductor structure 102. Prior to formation of the corresponding solder bumps, a well-step-coverage SiO$_2$ passivation layer could be deposited by PECVD to preserve the active region sidewalls. Photolithography and wet etching processes can then be used to define the solder bump patterns. The solder bumps, which may comprise tin (Sn), would then be electroplated onto the contacts.

The above-described process operations are assumed to be performed at the wafer level, and the processed wafer is then separated into individual integrated circuits. A given one of the integrated circuits is arranged into a flip-chip package by bonding to the submount 108 as previously described.

As mentioned previously, the groove formed in substrate 104 may take on a wide variety of different shapes in other embodiments. Examples are shown in FIGS. 7 through 12, each of which illustrates both a top-down view and a cross-sectional view of a particular type of groove formed in the substrate 104.

Figure 7:
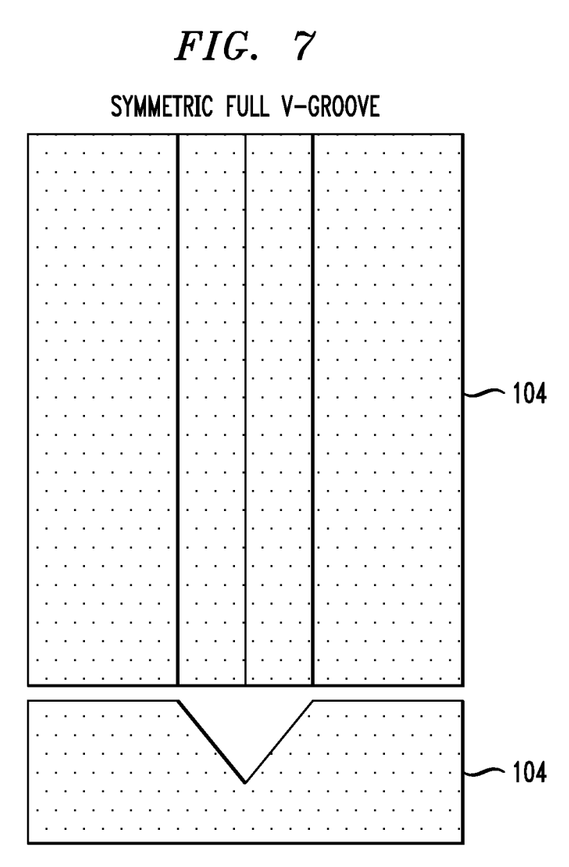
FIGS. 7 through 12 show different possible configurations for a substrate groove in a surface emitting laser in illustrative embodiments.
Figure 8:
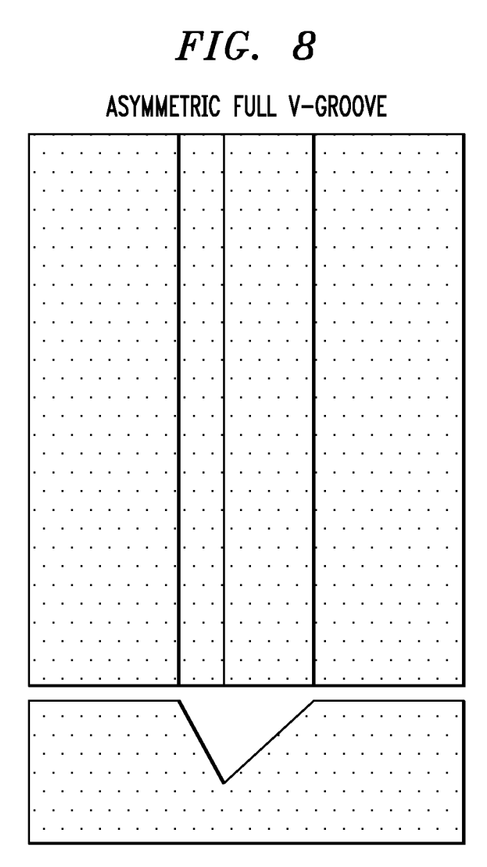

FIGS. 7 and 8 illustrate respective symmetric and asymmetric full v-grooves, where "full" in this context indicates that the v-groove spans the length of the portion of the substrate 104 illustrated in the corresponding figure.

Figure 9:
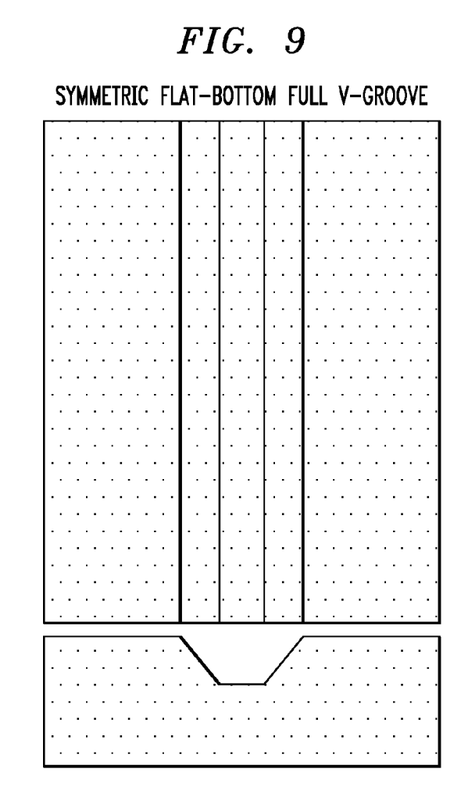
Figure 10:
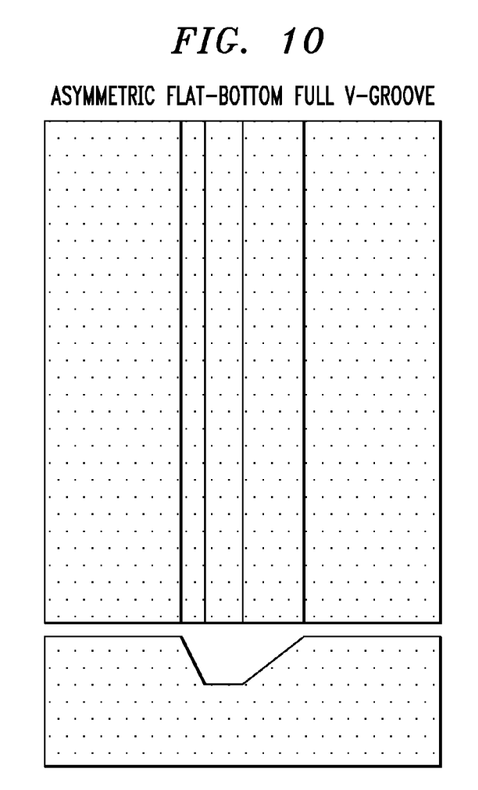

FIGS. 9 and 10 illustrate respective symmetric and asymmetric flat-bottom full v-grooves.

Figure 11:
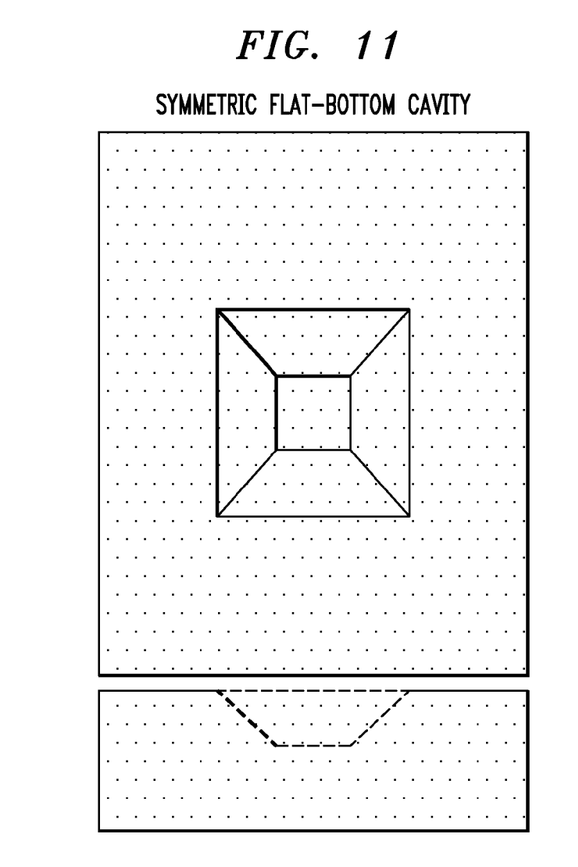
Figure 12:
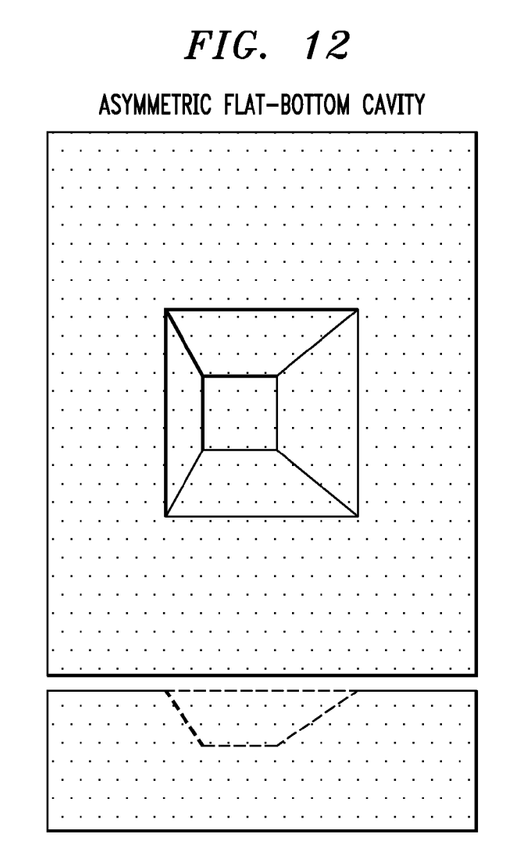

FIGS. 11 and 12 illustrate respective symmetric and asymmetric flat-bottom cavity grooves. The cavity grooves in these examples are quadrilateral cavities providing four reflecting surfaces, although other types of cavity grooves can be used in other embodiments. Also, cavity grooves need not be flat-bottom grooves.

In these exemplary groove arrangements, the side surfaces of the groove are used to provide respective angled light emission paths while also permitting light emission along an axis of the primary light emission path.

Numerous other shapes and arrangements of grooves are possible. For example, a given groove could be offset to one side of a device instead of being arranged in the middle of the device as in certain embodiments described above. Also, the groove can be rotated relative to its position in the embodiments described above. Moreover, alternative groove geometries are possible, including by way of example a groove that is in the form of a U-shaped trough. Again, the term "groove" as used herein is intended to be broadly construed so as to encompass these and other arrangements.

As mentioned previously, semiconductor optical emitting devices such as those described above can be implemented in the form of integrated circuits. In a given such integrated circuit implementation, identical die are typically formed in a repeated pattern on a surface of a semiconductor wafer. Each die includes circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of the invention.

Figure 13:
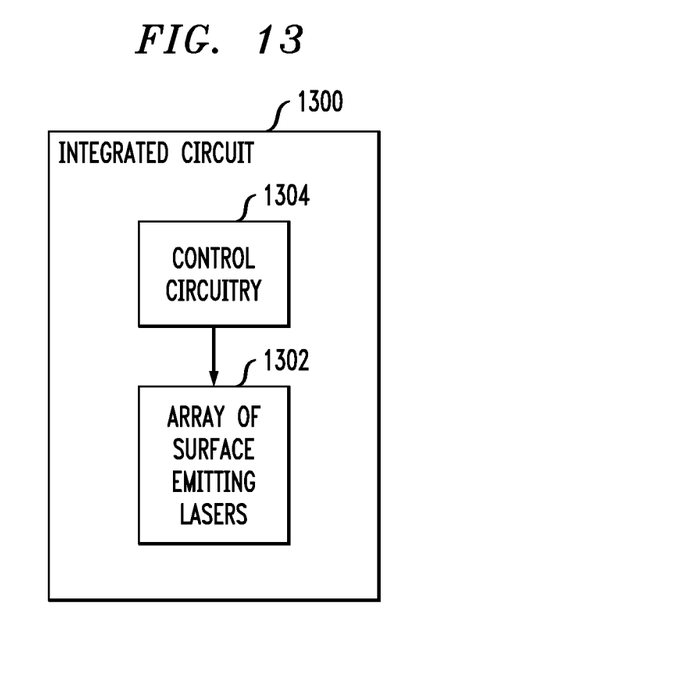
FIG. 13 shows an integrated circuit comprising an array of surface emitting lasers and associated control circuitry.

FIG. 13 shows one example of an integrated circuit embodiment of the invention. In this embodiment, an integrated circuit 1300 comprises an array 1302 of surface emitting lasers 100 each configured as previously described in conjunction with FIG. 1. Control circuitry 1304 is coupled to the array 1302 of surface emitting lasers and is configured to control generation of light by those surface emitting lasers. The integrated circuit 1300 may be implemented in a lighting system, an electronic display or another type of system or device.

Figure 14:
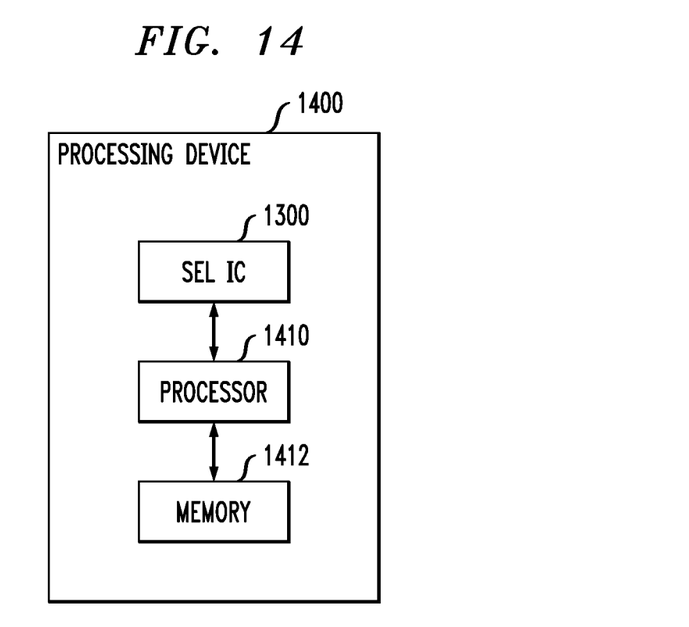
FIG. 14 shows a processing device that incorporates the integrated circuit of FIG. 13.

As another example, a given surface emitting laser integrated circuit 1300 may be incorporated into a processing device 1400 as illustrated in FIG. 14. Such a processing device may comprise a laptop or tablet computer, a mobile telephone, an e-reader or another type of processing device that utilizes one or more surface emitting laser integrated circuits to provide back lighting or for other functions.

In the processing device 1400, the surface emitting laser integrated circuit 1300 is coupled to a processor 1410 that controls generation of light by the corresponding array of surface emitting lasers.

The processor 1410 may comprise, for example, a microprocessor, an application-specific integrated circuit (ASIC), a field-programmable gate array (FPGA), a central processing unit (CPU), an arithmetic logic unit (ALU), a digital signal processor (DSP), or other similar processing device component, as well as other types and arrangements of circuitry, in any combination.

The processor 1410 is coupled to a memory 1412. The memory 1412 stores software code for execution by the processor 1410 in implementing portions of the functionality of the processing device 1400. A given such memory that stores software code for execution by a corresponding processor is an example of what is more generally referred to herein as a computer-readable medium or other type of computer program product having computer program code embodied therein, and may comprise, for example, electronic memory such as random access memory (RAM) or read-only memory (ROM), magnetic memory, optical memory, or other types of storage devices in any combination. As indicated above, the processor may comprise portions or combinations of a microprocessor, ASIC, FPGA, CPU, ALU, DSP or other circuitry. Such circuitry components utilized to implement the processor may comprise one or more integrated circuits.

The particular configurations of integrated circuit 1300 and processing device 1400 as shown in respective FIGS. 13 and 14 are exemplary only, and in other embodiments integrated circuits and processing devices may include other elements in addition to or in place of those specifically shown, including one or more elements of a type commonly found in conventional implementations of such circuits and devices.

It should again be emphasized that the embodiments of the invention as described herein are intended to be illustrative only. For example, other embodiments of the invention can be implemented utilizing a wide variety of different types and arrangements of semiconductor optical emitting devices, active semiconductor structures, substrates and grooves, than those utilized in the particular embodiments described herein. Also, the particular process operations and associated parameters such as materials, thicknesses, solutions and temperatures are exemplary only. In addition, the particular assumptions made herein in the context of describing certain embodiments need not apply in other embodiments. These and numerous other alternative embodiments within the scope of the following claims will be readily apparent to those skilled in the art.

What is claimed is:

1. A semiconductor optical emitting device comprising:
   an at least partially transparent substrate; and
   an active semiconductor structure arranged on a first side of the substrate;
   wherein a first portion of light generated by the active semiconductor structure is emitted through the substrate from the first side of the substrate to a second side of the substrate along a primary light emission path; and
   wherein the second side of the substrate has a groove formed therein with at least first and second surfaces configured to reflect respective additional portions of the light generated by the active semiconductor structure respective first and second angled light emission paths, wherein the first and second surfaces of the groove are metallized.

2. The device of claim 1, further comprising a submount configured to support the active semiconductor structure.

3. The device of claim 2, wherein contacts are formed on a surface of the submount for coupling to corresponding contacts of the active semiconductor structure.

4. The device of claim 3, wherein the contacts formed on the surface of the submount include first and second contacts coupled to respective n-contacts of the active semiconductor structure and a third contact coupled to a p-contact of the active semiconductor structure.

5. The device of claim 4, wherein the p-contact is associated with a reflector of the active semiconductor structure.

6. The device of claim 1, wherein the groove comprises at least one of a symmetric v-groove, an asymmetric v-groove, a symmetric flat-bottom groove, an asymmetric flat-bottom groove, a symmetric cavity groove, and an asymmetric cavity groove.

7. The device of claim 6, wherein the symmetric or asymmetric cavity groove comprises at least one of a quadrilateral cavity groove and a flat-bottom cavity groove.

8. The device of claim 1, wherein the at least partially transparent substrate comprises a sapphire substrate that is substantially transparent at one or more wavelengths of the light generated by the active semiconductor structure.

9. The device of claim 1, wherein the active semiconductor structure comprises a GaN structure.

10. The device of claim 1, wherein the device is implemented as one of a semiconductor laser and a light emitting diode.

11. The device of claim 1, wherein the groove is formed by etching through a patterned opening in a passivation layer formed on the second side of the substrate.

12. The device of claim 1, wherein the primary light emission path comprises first and second parallel light emission paths on respective opposite sides of the groove.

13. The device of claim 1, wherein the first and second angled light emission paths are in opposite directions to one another and substantially perpendicular to the primary light emission path.

14. The device of claim 1, wherein the groove has at least a third surface, wherein the first, second, and third surfaces are configured to reflect respective additional portions of the light generated by the active semiconductor structure along respective first, second, and third angled light emission paths.

15. A method comprising:
    providing an at least partially transparent substrate and an active semiconductor structure arranged on a first side of the substrate;
    generating light in the active semiconductor structure;
    emitting a first portion of the light generated by the active semiconductor structure through the substrate from the first side of the substrate to a second side of the substrate along a primary light emission path; and
    reflecting respective additional portions of the light generated by the active semiconductor structure from respective first and second surfaces of a groove formed in the second side of the substrate along respective first and second angled light emission paths, wherein the first and second angled light emission paths are generated as a result of metalizing the first and second surfaces of the groove.

16. The method of claim 15, further comprising forming the groove in the second side of the substrate by:
    forming a passivation layer on the second side of the substrate;
    patterning an opening in the passivation layer; and
    etching the groove into the second side of the substrate through the patterned opening in the passivation layer.

17. An apparatus comprising:
    one or more semiconductor optical emitting devices; and
    control circuitry coupled to said one or more semiconductor optical emitting devices for controlling generation of light by said one or more semiconductor optical emitting devices;
    at least a given one of the one or more semiconductor optical emitting devices comprising:
    an at least partially transparent substrate; and an active semiconductor structure arranged on a first side of the substrate;

wherein a first portion of light generated by the active semiconductor structure is emitted through the substrate from the first side of the substrate to a second side of the substrate along a primary light emission path; and wherein the second side of the substrate has a groove formed therein with at least first and second surfaces configured to reflect respective additional portions of the light generated by the active semiconductor structure along respective first and second angled light emission paths, wherein the first and second surfaces of the groove are metallized.

18. The apparatus of claim 17, wherein at least the one or more semiconductor optical emitting devices and the control circuitry are components of an integrated circuit.

19. The apparatus of claim 18, wherein the integrated circuit is a component of a processing device.

20. The apparatus of claim 17, wherein the one or more semiconductor optical emitting devices comprise an array of semiconductor optical emitting devices coupled to the control circuitry.

21. The apparatus of claim 17, wherein the one or more semiconductor optical emitting devices and the control circuitry are implemented in one of a lighting system and an electronic display.

* * * * *